(12) United States Patent
Uehran

(10) Patent No.: US 6,831,306 B1
(45) Date of Patent: Dec. 14, 2004

(54) EXTENDED LENGTH LIGHT EMITTING DIODE

(75) Inventor: Randy S. Uehran, Brookings, SD (US)

(73) Assignee: Daktronics, Inc., Brookings, SD (US)

(*) Notice: Subject to any disclaimer, the term of this patent is extended or adjusted under 35 U.S.C. 154(b) by 0 days.

(21) Appl. No.: 10/382,966

(22) Filed: Mar. 6, 2003

Related U.S. Application Data

(63) Continuation-in-part of application No. 10/091,435, filed on Mar. 6, 2002.

(51) Int. Cl.$^7$ ............................. H01L 33/00; H01L 23/29
(52) U.S. Cl. ............................. 257/100; 257/98; 257/99; 257/676; 257/791; 257/792; 438/22; 438/25; 438/26
(58) Field of Search ............................. 257/98–100, 676, 257/791–793, 743; 438/22, 25–28, 70, 100

(56) References Cited

U.S. PATENT DOCUMENTS 6,710,373 B2 * 3/2004 Wang ........................... 257/79

* cited by examiner

Primary Examiner—Donghee Kang
(74) Attorney, Agent, or Firm—Hugh D. Jaeger

(57) ABSTRACT

An extended length light emitting diode suitable for auto-insertion including an extended LED body region serving as a standoff or spacer to provide supported spacing from a circuit board to extend the LED die through a faceplate for suitable viewing and to serve as a structure through and about which the lower body portion of the LED and the LED leads can be stabilized and sealed to a printed circuit board. An alternative embodiment includes structure for sealing an LED to a faceplate.

1 Claim, 8 Drawing Sheets

EXTENDED LENGTH LIGHT EMITTING DIODE

CROSS REFERENCES TO RATED APPLICATIONS

This patent application is a continuation-in-part of Ser. No. 10/091,435 entitled "Extended Length Light Emitting Diode" filed on Mar. 6, 2002, pending.

BACKGROUND OF THE INVENTION

1. Field of the Invention

The present invention is for a light emitting diode, and in particular, provides for an extended length light emitting diode.

2. Description of the Prior Art

Light emitting diodes are incorporated into use for digit or pixel composition in scoreboards, message centers, graphic displays and the like whether indoors or outdoors. To improve viewability and to increase contrast, the main body of each LED extends individually through holes in a metal faceplate to form viewable alpha-numeric or graphic pixels or digits. The leads of multiple light emitting diodes (LEDs) are solder mounted to a printed circuit board. The relationship of the LEDs to the printed circuit board can take on several forms depending on if the display would be used inside or outside with respect to environmental sealing. Indoor use requires minimal sealing. However, if the display in which the LEDs are incorporated is for use in an outdoor environment, the LEDs can be flush mounted to a printed circuit board and a coating material can be applied to form a weatherproof seal to seal the base of the LED to the printed circuit board. Often a suitable seal with flush base mounting can be effected, but then the LED die, the region from which the light of an LED is emitted, may not extend a sufficient distance through the display faceplate hole to be adequately viewed. Although sealing may be completed between the base of the LED and the printed circuit board, the body of the LED does not necessarily seal to the display faceplate hole for complete sealing.

An alternative is provided whereby the LED body may be spaced from the printed circuit board by soldering the LED into place while spaced at a distance from the printed circuit board by varieties of spacing devices added between the LED and the printed circuit board or even more commonly by use of standoff tabs which are an integral part of the LED leads. Addition of spacers can include spacer devices which impart minimal stability of the LED. Often the spacers do not offer full support for the body of the LED nor do the spacers offer LED lead insulation or protection. Often spacers must be manually added, thus adding time and labor costs to the finished display product.

Such methods provide spacing and allow protrusion of the LED body through the faceplate, but application of coating material to the exposed leads of the LED extending between the body of the LED and the printed circuit board is difficult at best. Although spacing can be adequate with the preceding method, the bendable leads of the LEDs are subject to misalignment if not handled carefully and could make alignment with the holes in the faceplate difficult.

As the leads of the LEDs are electrically exposed to surrounding peripherally located cabinetry and support or other spacing members, or if gross misalignment of the LED to and through the faceplate holes occurs, and because the leads of the LEDs are subject to bending or misalignment, a potting compound can be made to flow about and to surround the LED leads thus sealing the LED base and the LED leads against environmental and other elements, whereby stability of the LEDs is subsequently provided. However, such a process is time consuming and economically undesirable.

Clearly what is needed is an auto-insertable LED which avoids costly and timely spacing schemes having structure which can provide for adequate supported spacing of the main structure or body of an LED, including the LED die, from a printed circuit board while simultaneously providing for suitable projection of the LED die sufficiently through a faceplate and promoting of structure suitable for adequate sealing of the lower body portion of the LED and of the LED leads connected to the printed circuit board, and, in the alternative or in addition to, sealing of the LED body to a faceplate to provide yet more complete sealing. The present invention provides for such as described herein.

SUMMARY OF THE INVENTION

The general purpose of the present invention is to provide an extended length light emitting diode.

According to one embodiment of the present invention, there is provided an extended length light emitting diode having an extended LED body region substantially integral to and extending and making longer the length of the body of a light emitting diode. The extended length light emitting diode, which conforms to a cylindrically or other geometrically shaped LED body, extends over and about a portion of the LED electrical connection leads, thereby insulating and supporting the covered portion of the connection leads. Such extension of the light emitting diode body terminates as a base which can align flush to a printed circuit board. The extended length of the light emitting diode allows for auto-insertion into a printed circuit board without an interceding spacer between the printed circuit board and extended length light emitting diode. A first alternative embodiment discloses an LED body extension for addition to a generic diode, and a second alternative embodiment discloses an LED having an enlarged extended LED body region for sealing of an LED to a display faceplate hole.

One significant aspect and feature of the present invention is an extended length light emitting diode which spaces an LED at a predetermined distance from a printed circuit board.

Another significant aspect and feature of the present invention is an extended length light emitting diode which spaces an LED die at a predetermined distance from an appropriately situated faceplate.

Still another significant aspect and feature of the present invention is an extended length light emitting diode which covers and electrically insulates a portion of LED leads from any adjacent metal support structures.

Yet another significant aspect and feature of the present invention is an extended length light emitting diode which supports and stabilizes an LED.

A further significant aspect and feature of the present invention, as illustrated in an alternative embodiment, is an add-on light emitting diode body extension region which can be aligned and attached to an existing unmounted LED to space the LED from a printed circuit board, as well as addressing the other significant aspects and features listed above.

A yet further significant aspect and feature of the present invention is an extended length light emitting diode of the first embodiment which is suited for printed circuit board auto-insertion.

A still further significant aspect and feature of the present invention is an extended length light emitting diode of the first embodiment which does not require the use of manually placed spacing devices.

An additional significant aspect and feature of the present invention is an extended length light emitting diode having an enlarged extended LED body region which spaces an LED at a predetermined distance from a printed circuit board, which spaces an LED die at a predetermined distance from an appropriately situated faceplate, and which seals an LED to a display faceplate hole.

Having thus described embodiments of the present invention, it is the principal object of the present invention to provide an extended length light emitting diode.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
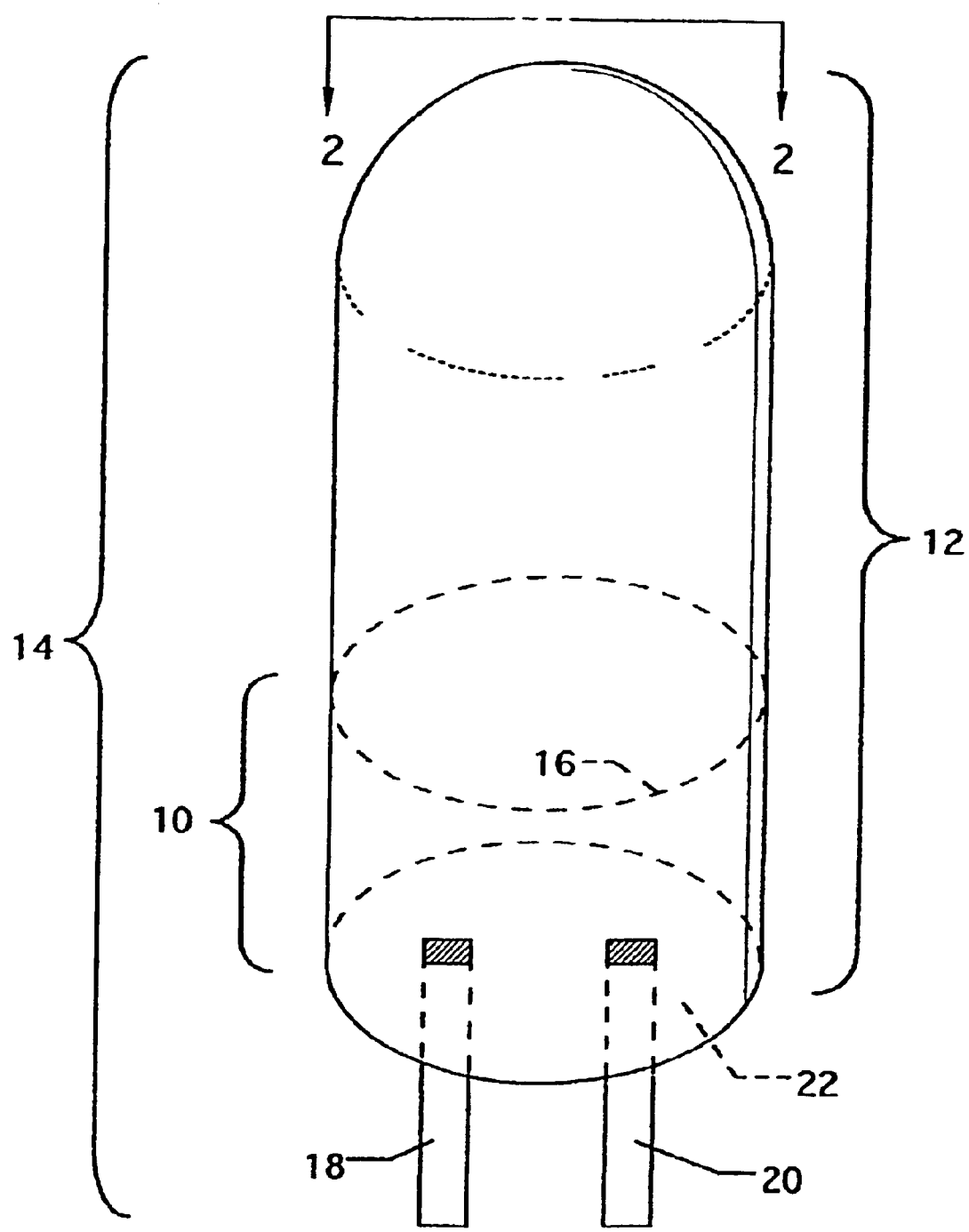
FIG. 1 illustrates an extended length light emitting diode, the present invention, having an extended LED body region substantially integral to and extending downwardly and adding to the length of the body of a light emitting diode.

FIG. 1*t* illustrates the present invention, an extended length light emitting diode 14, also referred to as LED 14, having an extended LED body region 10, shown substantially integral to and extending downwardly from a reference plane 16, shown in a dashed line, extending through the extended length light emitting diode 14, thereby adding to the length of the body 12 of the extended length light emitting diode 14. Reference plane 16, which shows the lower base limits of some commonly found LEDs, is included for purposes of illustration and clarity and is not part of the invention. The extended LED body region 10, also shown in FIG. 2, extends downwardly to cover and encompass an upper portion of LED electrical connection leads 18 and 20. The extended LED body region 10 terminates as a planar base 22 distanced from the lower ends of the LED electrical connection leads 18 and 20. The body 12 and the extended LED body region 10 are fashioned of a suitable plastic or other suitable material where one such material could be epoxy.

Figure 2:
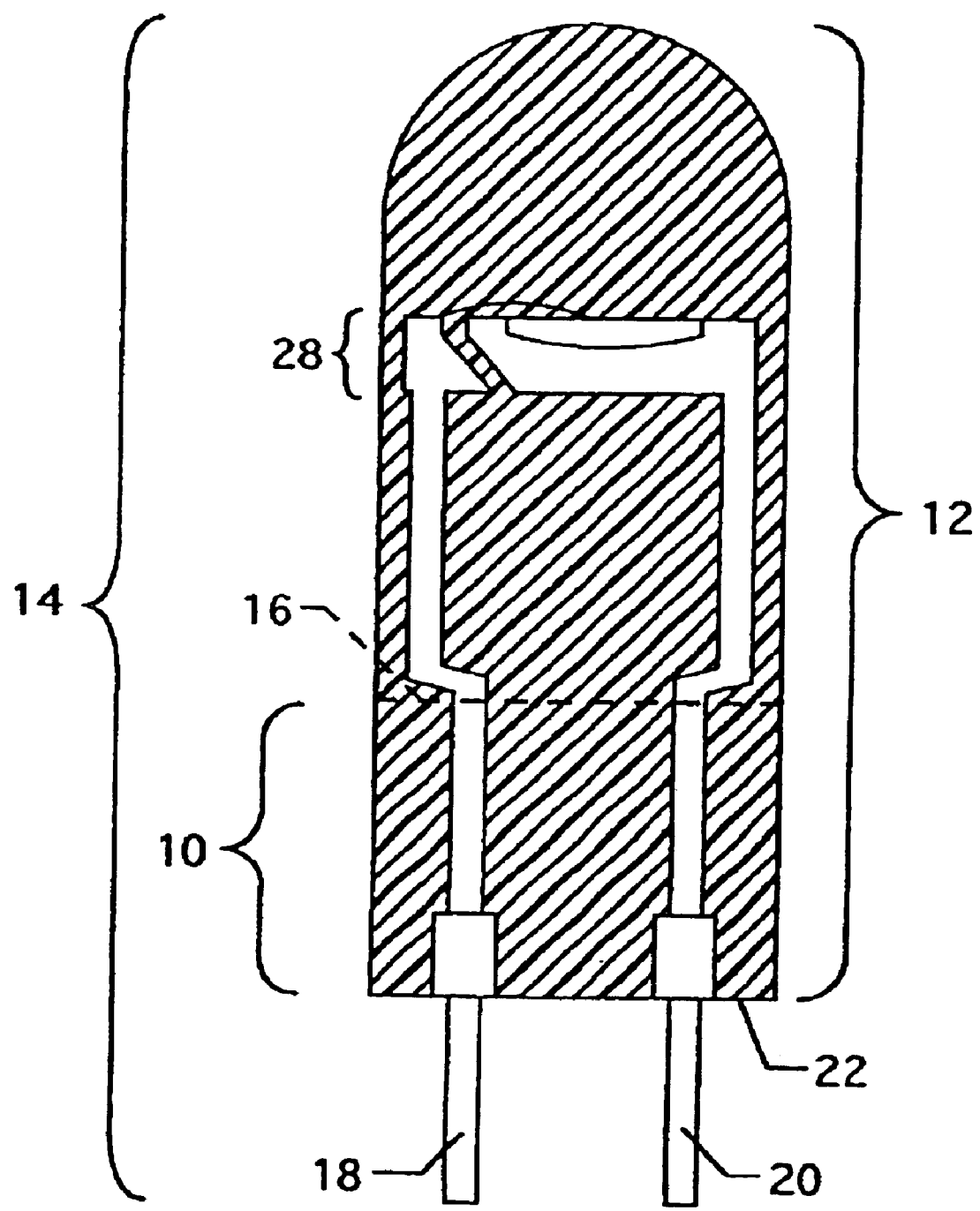
FIG. 2 illustrates a cross section view of FIG. 1 along line 2—2 of FIG. 1.
Figure 3:
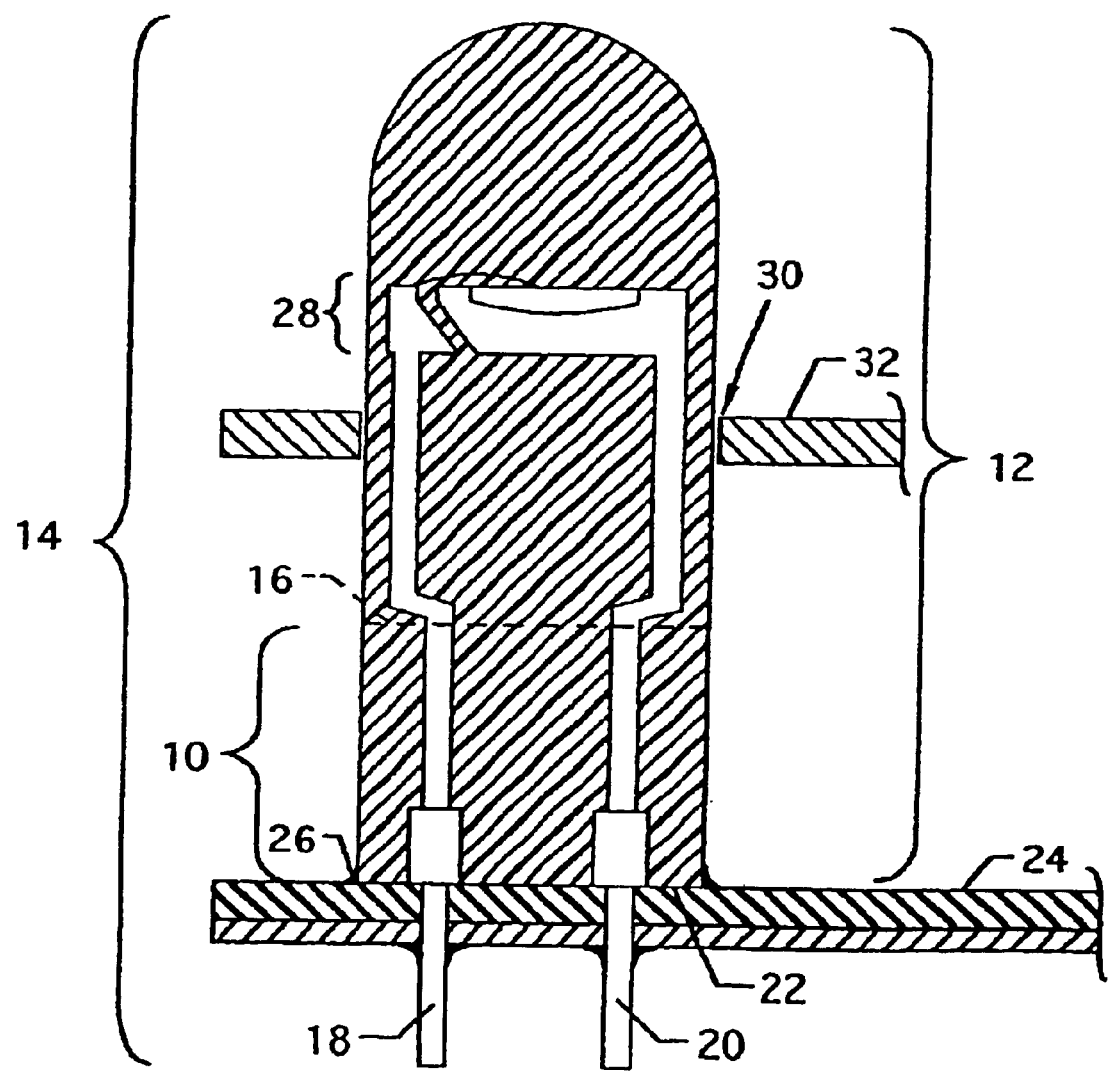
FIG. 3 illustrates the embodiment of FIG. 2 flush mounted and soldered to a printed circuit board.

FIG. 2 illustrates a cross section view of FIG. 1 along line 2—2 of FIG. 1. Illustrated in particular is the extended LED body region 10 extending downwardly over and about the upper regions of the LED electrical connection leads 18 and 20 which lead to the internally located components of the extended length light emitting diode 14. The lower regions of the LED electrical connection leads 18 and 20 which are not covered by the extended LED body region 10 are available for placement through and connection to a printed circuit board, as shown in FIG. 3. The planar base 22 is available for flush placement and mounting on the upper surface of a printed circuit board subsequent to which a coating material may be applied to seal around the planar base 22 of the extended length light emitting diode 14.

FIG. 3 illustrates the embodiment of FIG. 2 flush mounted and soldered to a printed circuit board 24 subsequent to auto-insertion. Coating material 26 is shown applied around and about the periphery of the planar base 22 to seal the lower region of the extended length light emitting diode 14 to the upper surface of the printed circuit board 24. The LED die 28, which is the area from which light is emitted, is shown placed as desired in a position well through a hole 30 in a faceplate 32 which is well suited for viewability. Flush mounting of the planar base 22 provided by the extended LED body region 10 to the printed circuit board 24 as well as providing for sealing processes provides for accurate placement and excellent supported stability of the body 12 of the extended length light emitting diode 14 with respect to the printed circuit board 24 and with respect to holes 30 in the faceplate 32. Auto-insertion of the extended length light emitting diode 14 is readily and easily accomplished by auto-insertion equipment and, thus, the time-consuming manual placement of stand-alone spacing devices is obviated.

Figure 4:
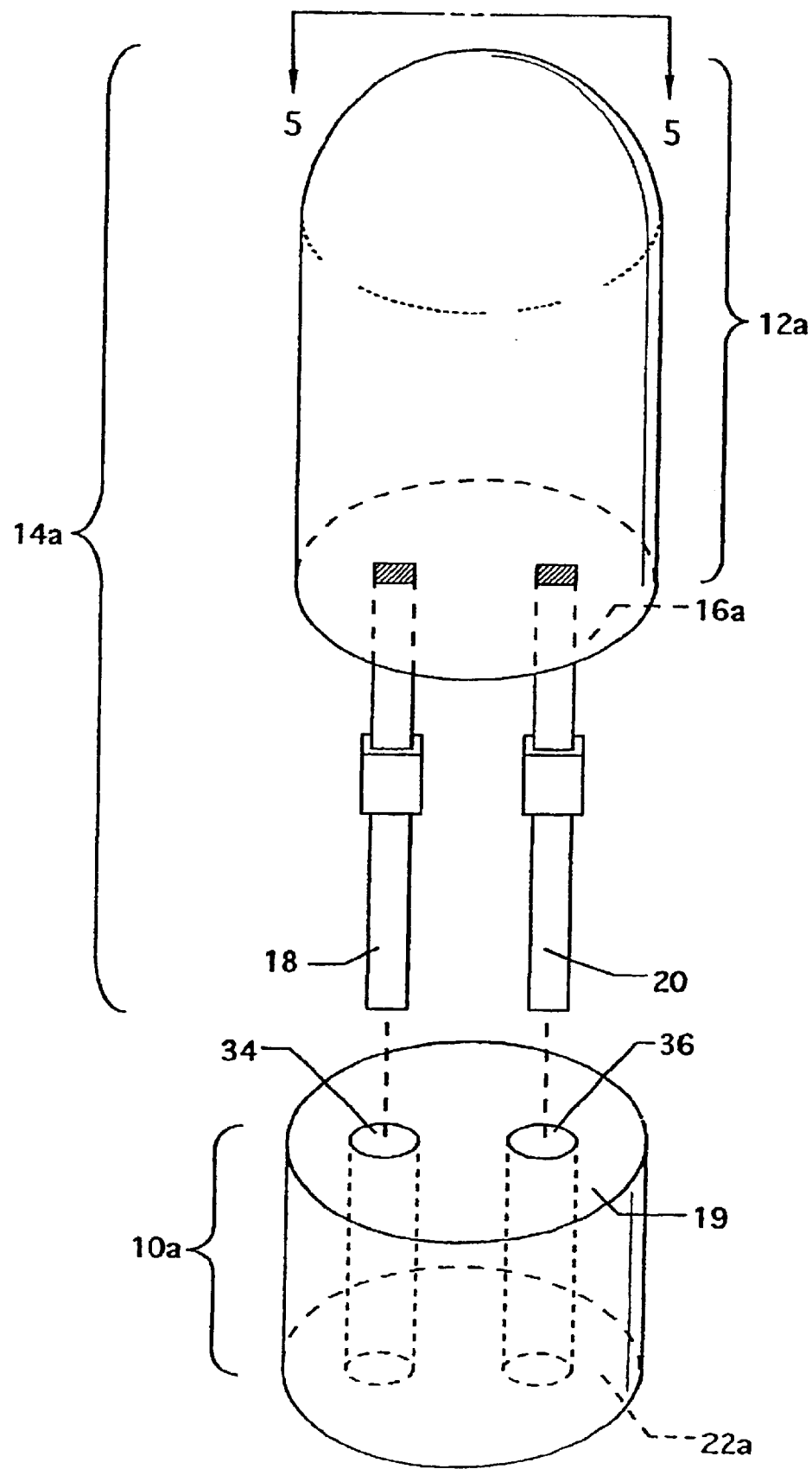
FIG. 4, an alternative embodiment, illustrates an LED body extension which in its structure is separate from the body of an LED and which can be aligned to or aligned to and attached to, such as by an adhesive, a lower planar base of an LED body to form a combined LED and LED body extension structure.
Figure 5:
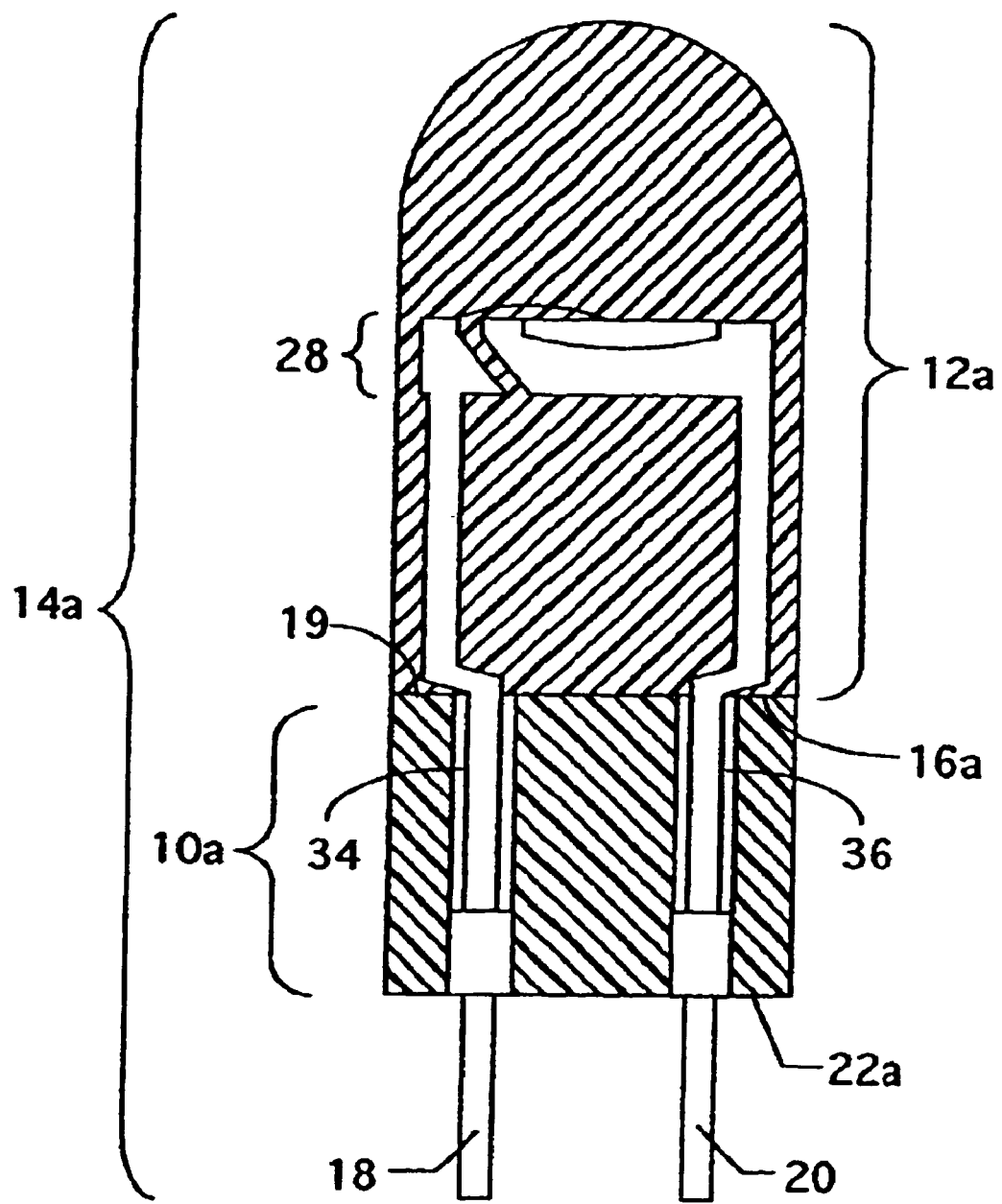
FIG. 5 illustrates a cross section view of FIG. 4 along line 5—5 of FIG. 4 where the LED body extension and the light emitting diode are mated in full combination.

FIG. 4 an alternative embodiment, illustrates an LED body extension 10a which in its structure is separate from the body 12a of a light emitting diode 14a and which can be aligned to or aligned to and attached to, such as by an adhesive, a lower planar base 16a of the body 12a to form a combined stable structure consisting of the LED 14a and the attached LED body extension 10a, such as illustrated in FIG. 5. Such a combination allows a user to combine the LED body extension 10a with in-stock LEDs without having to produce a one-piece LED having an extended LED body region 10, such as previously described. The LED body extension 10a is appropriately shaped to conform to the horizontal cross section shape of an LED and includes an upper planar surface 19 and an opposing lower planar surface 22a. Geometrically configured and vertically aligned holes 34 and 36 extend vertically between the upper planar surface 19 and the lower planar surface 22a of the LED body extension 10a to accommodate engagement of the electrical connection leads 18 and 20 and to provide for insulation of the electrical connection leads 18 and 20. The body 12a and the LED body extension 10a are fashioned of a suitable plastic or other suitable material where one such material could be epoxy.

FIG. 5 illustrates a cross section view of FIG. 4 along line 5—5 of FIG. 4 where the LED body extension 10a and the light emitting diode 14a are mated in full combination. Illustrated in particular is the LED body extension 10a aligned over and about the upper regions of the LED electrical connection leads 18 and 20 which lead to the internally located components of the LED 14a. The lower regions of the LED electrical connection leads 18 and 20 which are not covered by the LED body extension 10a are available for placement through and connection to a printed circuit board. The mated lower planar base 16a of the light emitting diode 14a and upper planar surface 19 of the LED body extension 10a provider for stable planar surface to planar surface support of the light emitting diode 14a. The planar base 22a is available for flush placement and mounting on the upper surface of a printed circuit board subsequent to which a coating material may be applied to seal around the planar base 22a of the LED 14a.

Figure 6:
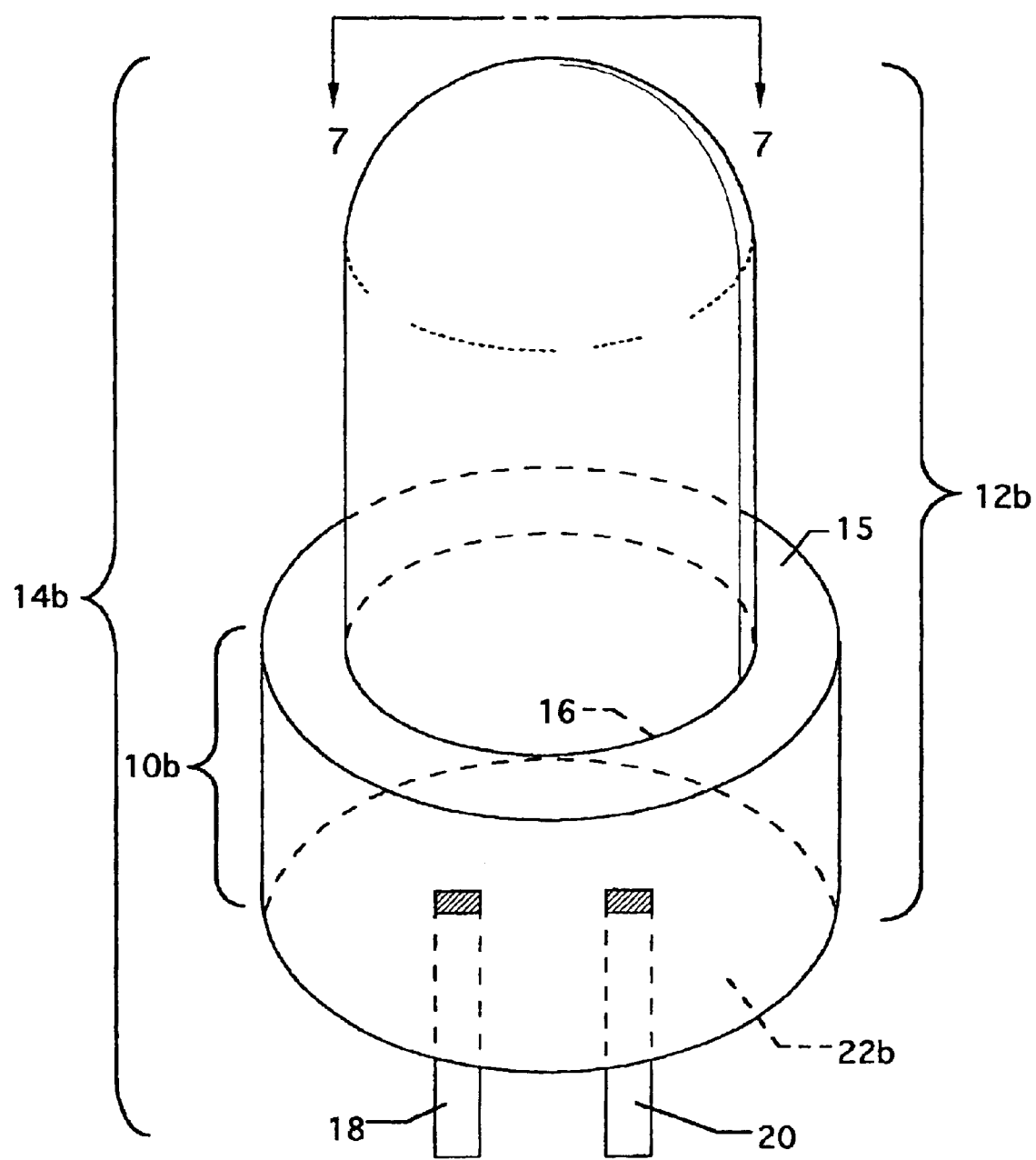
FIG. 6, a second alternative embodiment, illustrates an extended length light emitting diode incorporating an enlarged extended LED body region.

FIG. 6, a second alternative embodiment, illustrates an extended length light emitting diode 14b, also referred to as LED 14b, incorporating many of the features of the previously described embodiments and additionally including an enlarged extended LED body region 10b replacing the extended LED body region 10 of FIGS. 1, 2 and 3 shown substantially integral to and extending downwardly from the reference plane 16, shown in a dashed line, extending through the extended length light emitting diode 14b, thereby adding to the length of the body 12b of the extended length light emitting diode 14b. Reference plane 16, which shows the lower base limits of some commonly found LEDs, is included for purposes of illustration and clarity and is not part of the invention. The enlarged extended LED body region 10b, also shown in FIGS. 7 and 8, extends downwardly and outwardly and covers and encompasses an upper portion of LED electrical connection leads 18 and 20. A planar sealing surface 15, of annular or other suitable configured shape, aligns to the reference plane 16 and extends outwardly from the intersection of the body 12b and the reference plane 16 to delineate the vertical profile of the enlarged extended LED body region 10b. The enlarged extended LED body region 10b terminates as a planar base 22b distanced from the lower ends of the LED electrical connection leads 18 and 20. The body 12b including the enlarged extended LED body region 10b is fashioned of a suitable plastic or other suitable material where one such material could be epoxy.

Figure 7:
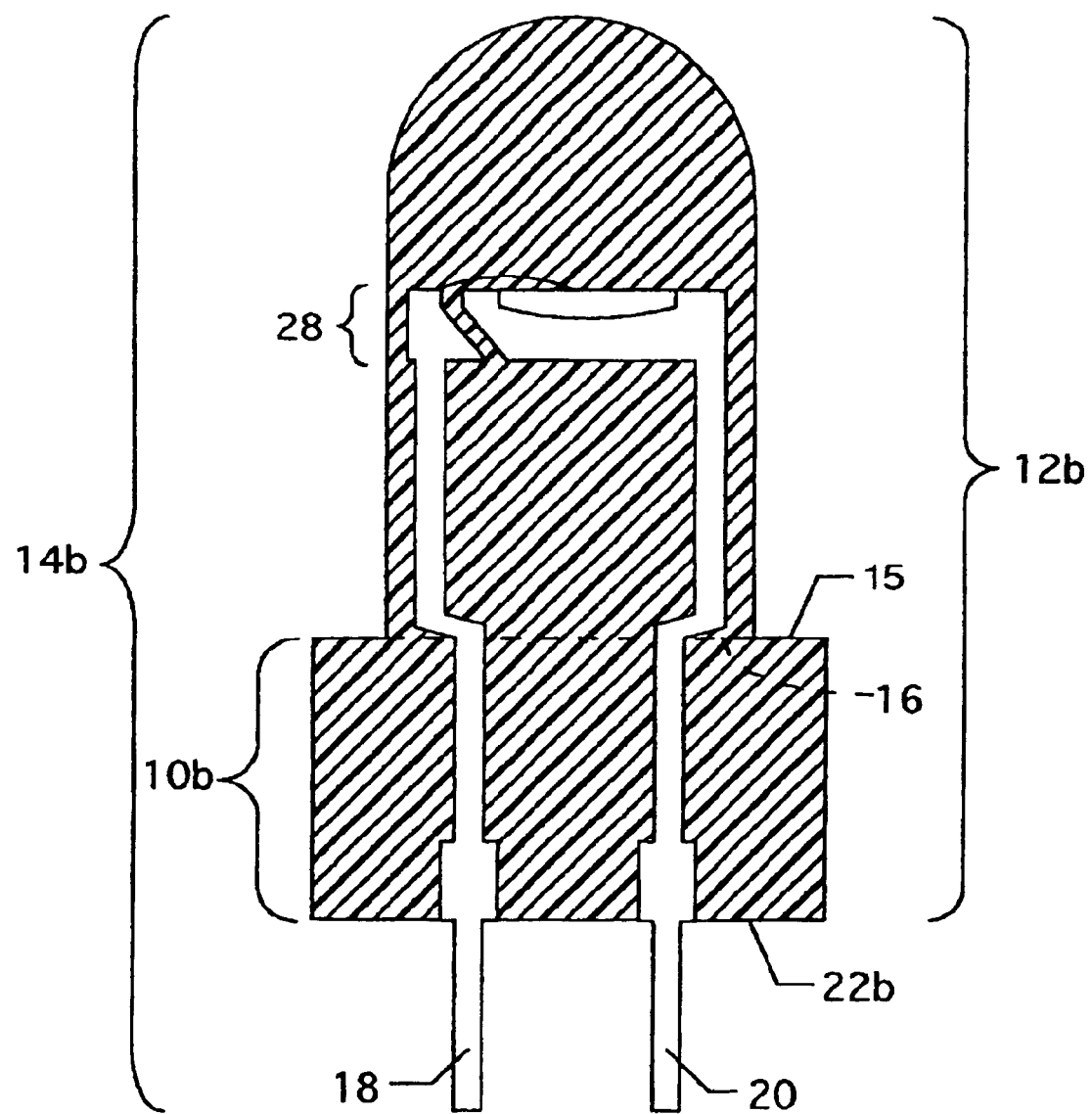
FIG. 7 illustrates a cross section view of FIG. 6 along line 7—7 of FIG. 6; and, FIG. 8 illustrates the embodiment of FIG. 7 where the extended length light emitting diode is aligned with and extending through a hole in a faceplate and where a sealing surface of the enlarged extended LED body region is sealingly aligned about the hole and to the faceplate.

FIG. 7 illustrates a cross section view of FIG. 6 along line 7—7 of FIG. 6. Illustrated in particular is the enlarged extended LED body region 10b extending downwardly over and about the upper regions of the LED electrical connection leads 18 and 20 which lead to the internally located components of the extended length light emitting diode 14b. The lower regions of the LED electrical connection leads 18 and 20 which are not covered by the enlarged extended LED body region 10b are available for placement through and connection to a printed circuit board, as shown in FIG. B. The planar base 22b is available for flush placement and mounting on the upper surface of a printed circuit board subsequent to which a coating material may be applied to seal around the planar base 22b of the extended length light emitting diode 14b. The sealing surface 15 is available for mating !about a hole in the faceplate 32 and sealing to the faceplate 32, as illustrated in FIG. 8.

Figure 8:
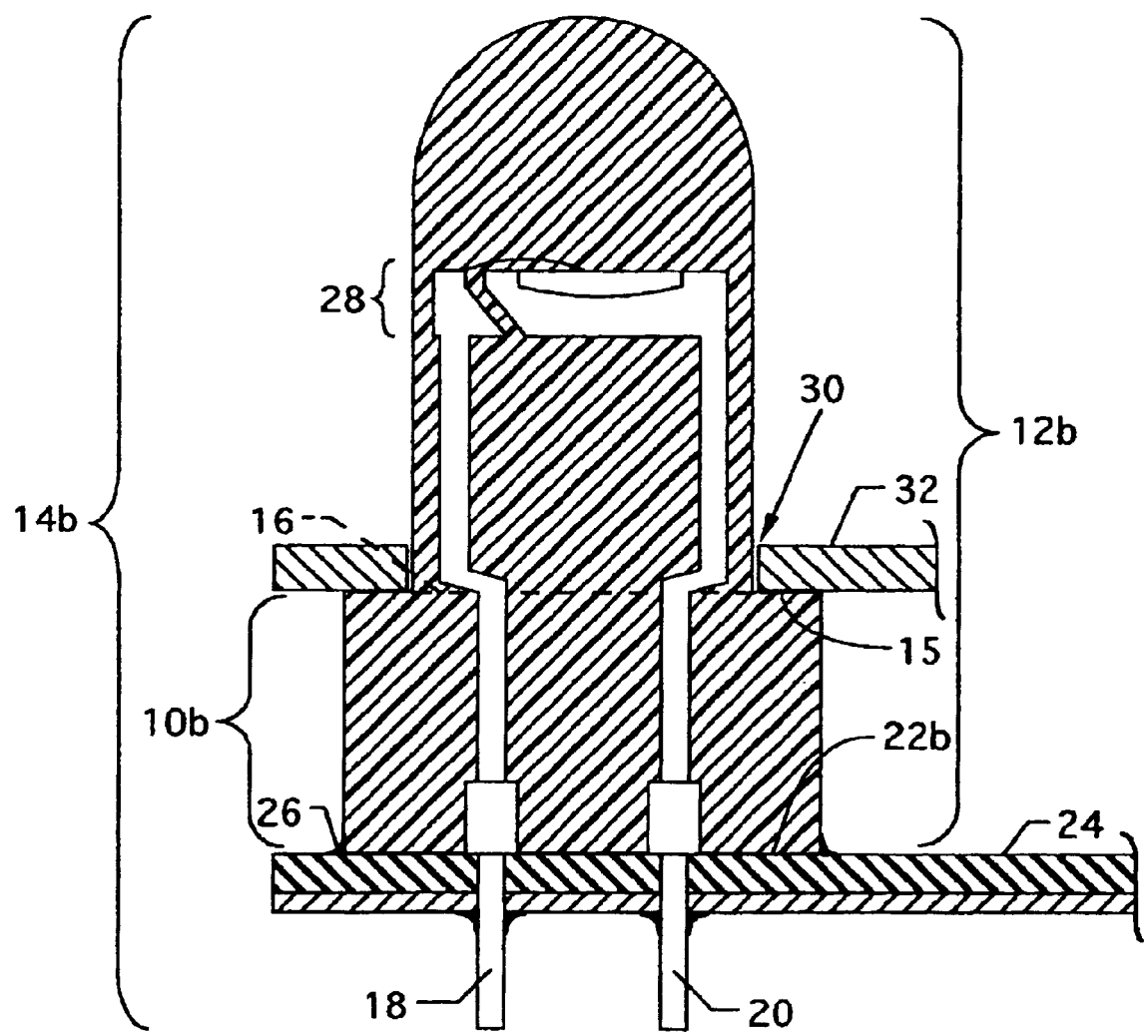

FIG. 8 illustrates the embodiment of FIG. 7 where the extended length light emitting diode 14b is aligned with and extending through the hole 30 in the faceplate 32 and where the sealing surface 15 of the enlarged extended LED body region 10b is sealingly aligned about the hole 30 and to the faceplate 32. Alternatively, a gasket of suitable material or a sealant could be incorporated between the sealing surface 15 and the faceplate 32 to provide for sealing as required. Also illustrated is the extended length light emitting diode 14b flush mounted and soldered to a printed circuit board 24 subsequent to auto-insertion. Coating material 26 is shown applied around and about the periphery of the planar base 22b to seal the lower region of the extended length light emitting diode 14b to the upper surface of the printed circuit board 24. The LED die 28, which is the area from which light is emitted, is shown placed as desired in a position well through a hole 30 in the faceplate 32 which is well suited for viewability. Flush mounting of the planar base 22b provided by the enlarged extended LED body region 10b to the printed circuit board 24 as well as provision for sealing processes provides for accurate placement and excellent supported stability of the body 12b of the extended length light emitting diode 14b with respect to the printed circuit board 24 and with respect to holes 30 in the faceplate 32. Stability between the printed circuit board 24 and the faceplate 32 is also enhanced and improved by the interfacing of the enlarged extended LED body region 10b therebetween. Auto-insertion of the extended length light emitting diode 14b is readily and easily accomplished by auto-insertion equipment and, thus, the time-consuming manual placement of stand-alone spacing devices is obviated.

Various modifications can be made to the present invention without departing from the apparent scope hereof.

| PARTS LIST | |
|---|---|
| 10 | extended LED body region |
| 10a | LED body extension |
| 10b | enlarged extended LED body region |
| 12 | body |
| 12a | body |
| 12b | body |
| 14 | extended length light emitting diode |
| 14a | light emitting diode |
| 14b | extended length light emitting diode |
| 15 | sealing surface |
| 16 | reference plane |
| 16a | lower planar base |
| 18 | electrical connection lead |
| 19 | upper planar surface |
| 20 | electrical connection lead |
| 22 | planar base |
| 22a | lower planar surface |
| 22b | planar base |
| 24 | printed circuit board |
| 26 | coating material |
| 28 | LED die |
| 30 | hole |
| 32 | faceplate |
| 34 | hole |
| 36 | hole |

What is claimed is:
1. An extended length light emitting diode comprising an enlarged extended LED body region said enlarged extended LED body region extending outwardly and downwardly from below a body of a light emitting diode, thereby defining a sealing surface, which sealing surface allows for sealing of an LED to a display faceplate adjacent a display faceplate hole and which enlarged extended LED body spaces said body of said light emitting diode at a predetermined distance from a printed circuit board, and which in turn spaces an LED die encompassed within said body of said light emitting diode at a predetermined distance from an appropriately situated faceplate.

* * * * *